United States Patent [19]

Jone

[11] 4,079,314
[45] Mar. 14, 1978

[54] PINCETTE TYPE MULTI-TESTER

[76] Inventor: Woo Chul Jone, 623-1 Ahyun-dong, Mapo, Seoul, South Korea

[21] Appl. No.: 617,917

[22] Filed: Sep. 29, 1975

[30] Foreign Application Priority Data

Oct. 12, 1974 South Korea .................. 5331/74[U]

[51] Int. Cl.² ............................................ G01R 1/06
[52] U.S. Cl. .................................................... 324/149
[58] Field of Search ...................... 324/72.5, 149, 115, 324/51

[56] References Cited

U.S. PATENT DOCUMENTS

| 2,586,203 | 2/1952 | Boyle | 324/72.5 |
| 3,555,420 | 1/1971 | Schwartz | 324/149 |

Primary Examiner—Rudolph V. Rolinec
Assistant Examiner—Vincent J. Sunderdick
Attorney, Agent, or Firm—Ladas, Parry, Von Gehr, Goldsmith & Deschamps

[57] ABSTRACT

A pincette type multi-tester having a body portion, a minus checking bar which is rigidly attached to the bottom of said body and extending downwardly therefrom, a plus checking bar which is removably and pivotally affixed to the bottom of said body at a location spaced from said minus checking bar. The plus checking bar has a flexible helical electrical wire affixed to the top thereof which wire is electrically connected to said body at the top of the body. A flexible clip is provided located on the bottom of said body which engages the top of the plus checking bar and allows for the pivotal movement thereof as well as for complete manual disengagement therefrom.

1 Claim, 3 Drawing Figures

PINCETTE TYPE MULTI-TESTER

This invention is related to a multi-tester, one checking bar of which is fixed on the side of the tester and the other one of which is connected with a helical conductor to the top of the tester. In short distance test, the movable checking bar is inserted into elastic contact strips and then tester can be used as a pincette type tester. In a long distance test, the movable checking bar is released from the elastic contact strips.

This invention is related to the pincette type multi-tester especially convenient for portable and usage. The tester of prior art included two checking bars connected to the end of plug, which is inserted into the jack of the tester. Therefore the lead line is easy to be entangled each other, contact fault of plug and jack may cause the measurement error and the tester was not pocketable.

The pincette type tester of this invention is constructed with a tester body and two checking bars as a mini-type and is more useful and convenient than the prior art tester. In a short distance test, of small checking part, it is useful to hold two checking bars as a pincette, and in a long distance test of two checking parts apart, the movable checking bar is separated from the elastic contact strips of tester body.

A more detailed description of the invention is given in the following pages and accompanying of which, FIG. 1 is a drawing of squinting view of the multi-tester, a movable checking bar of which is taken from the tester body for a long distance test.

Figure 1:
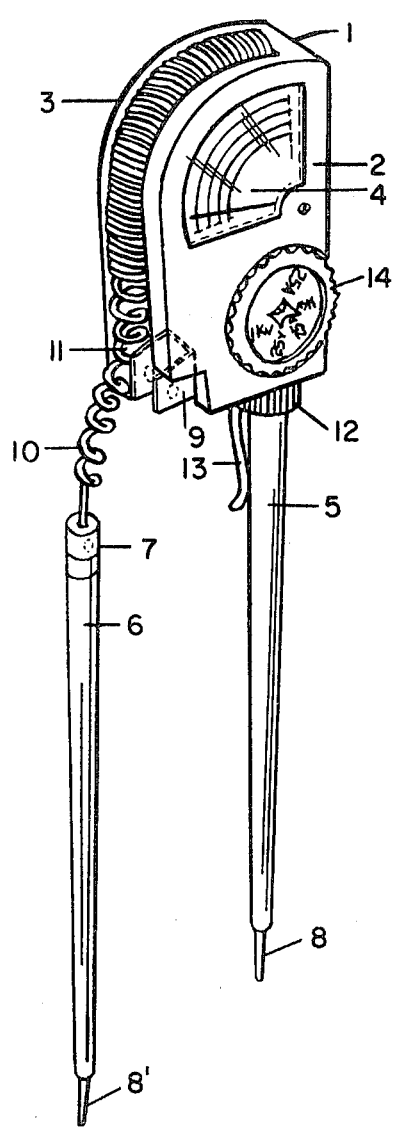
Figure 2:
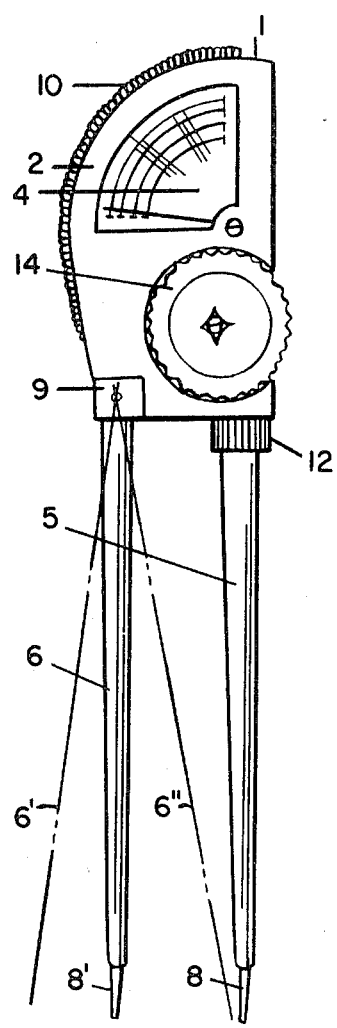
FIG. 2 is a drawing of the front view of the invention, a movable checking bar of which is inserted into the elastic contact strips for a short distance test.
Figure 3:
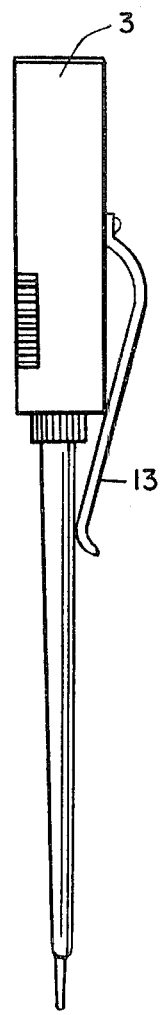
FIG. 3 is a drawing of side view of the multi-tester.

In FIGS. 1 and 2, a well-known meter part 4 is located on the upper part of body 1, the front part of which is a plastic chassis body 2 and the back part an opening steel box 3. The lower part of body 1 has a rotary switch 14 for changing the measuring range.

For fixing minus checking bar 5 and plus checking bar 6 on the both bottom sides of body 1, the minus checking bar is connected to the meter part 4 and fixed by nut on the inner part of chassis body 2 insulated from the conductor, and the plus checking bar 6 connected to the meter part 4 by means of spiral winding 10 is combined movably with elastic contact strips 9 at a concave groove 7 of the upper core 8' of checking bar 6. The elastic stress of helical winding 10 makes its safe entrance on concave opening 11. The plus checking bar has free movable range from 6' to 6' as shown in FIG. 2, and can be separated from the elastic contact strips 9 for a long distance test. A ring type zero adjust knob 12 is at the upper part of minus checking bar 5 and a pocket hanger 13 is fixed on the literal side of body 1.

The applying range of this invention is voltage, current and resistance measuring, however, capacity, reactance and decibel measuring may be added and also this invention can be further equipped with a clamp adaptor or combined with neon driver.

Silver battery is used for the voltage source and the network of this invention is well known to the engineers of this field.

It should be understood, of course, that the embodiment disclosed above is merely illustrative and are not intended to limit the scope of the invention.

What is claimed:

1. A pincette type multi-tester comprising a body portion, a minus checking bar which is rigidly attached to the bottom of said body and extends downwardly therefrom, a plus checking bar which is removably and pivotally affixed to the bottom of said body at a location spaced from said minus checking bar, said plus checking bar having a flexible helical electrical wire affixed to the top thereof which wire is electrically connected to said body at the top thereof, a flexible clip located on the bottom of said body which engages the top of said plus checking bar and allows for pivotal movement of said plus checking bar as well as for complete manual disengagement therefrom, and said body having an elongated groove therein which extends from said clip to the location of the attachment of said wire to said body, said groove partially retaining said helical wire when said plus checking bar is retained in said clip.

* * * * *